(12) United States Patent
Watt

(10) Patent No.: US 6,492,710 B1
(45) Date of Patent: Dec. 10, 2002

(54) SUBSTRATE ISOLATED TRANSISTOR

(75) Inventor: Jeffrey T. Watt, Palo Alto, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/877,905

(22) Filed: Jun. 7, 2001

(51) Int. Cl.[7] .......................... H01L 21/76; H01L 29/00
(52) U.S. Cl. ....................... 257/544; 438/220; 438/356; 257/547
(58) Field of Search ............................ 257/499, 544, 257/547; 438/220, 356, 414

(56) References Cited

U.S. PATENT DOCUMENTS

| | | | |
|---|---|---|---|
| 3,838,439 A | * | 9/1974 | Biard ........................... 357/30 |
| 4,001,050 A | * | 1/1977 | Koo ............................. 148/1.5 |
| 5,478,761 A | * | 12/1995 | Komori et al. ............... 438/414 |
| 5,497,023 A | * | 3/1996 | Nakazato et al. ............ 257/394 |
| 5,716,866 A | * | 2/1998 | Dow et al. ................... 438/414 |
| 6,002,162 A | * | 12/1999 | Takahashi et al. ........... 257/544 |
| 6,194,776 B1 | * | 2/2001 | Amano et al. ............... 257/550 |
| 6,337,506 B2 | * | 1/2002 | Morishita et al. ............ 257/500 |

FOREIGN PATENT DOCUMENTS

EP    000683521 A1 *  5/1994  ......... H01L/27/092

* cited by examiner

Primary Examiner—Olik Chaudhuri
Assistant Examiner—David S Blum
(74) Attorney, Agent, or Firm—Kevin L. Daffer; Conley, Rose & Tayon P.C.

(57) ABSTRACT

A device and a method are provided for isolating a circuit well from a substrate of the same conductivity type. In particular, an integrated circuit is provided which includes a circuit well arranged over a semiconductor substrate with no layer of opposite conductivity type arranged between the well and the substrate. The integrated circuit may further include a pair of isolation wells extending along opposite lateral boundaries of the circuit well. The isolation wells and circuit well may be adapted such that a single continuous depletion region underlying the circuit well may be formed upon application of an isolation voltage between the substrate and the pair of isolation wells. The formation of such a depletion region may beneficially isolate the circuit well from the underlying substrate.

17 Claims, 6 Drawing Sheets

SUBSTRATE ISOLATED TRANSISTOR

BACKGROUND OF THE INVENTION

1. Field of the Invention

This invention relates to semiconductor device manufacturing, and more particularly, to an improved method for forming an integrated circuit.

2. Description of the Related Art

The following descriptions and examples are not admitted to be prior art by virtue of their inclusion within this section.

In the fabrication of metal-oxide-semiconductor ("MOS") transistors, a gate conductor may be arranged upon a gate dielectric, which may be formed upon a substrate. Typically, the gate dielectric is laterally interposed between source and drain regions formed in the substrate, where the source and drain regions may be doped to opposite conductivity type (either n-type or p-type) than the substrate. N-type source/drain regions may be used to form n-channel transistors, and p-type source/drain regions may be used to form p-channel transistors. In complementary MOS ("CMOS") circuits employing both n-channel and p-channel transistors, n-channel transistors may be formed in p-type "wells" within the substrate, while p-channel transistors may be formed in n-type wells. Such wells may be formed by selectively doping the region of the substrate underlying the subsequently formed gate conductor.

In many instances, electrical isolation between a transistor and an underlying substrate may be beneficial, particularly between a well and a substrate of a CMOS transistor. For example, electrical isolation may be beneficial in non-volatile memory circuits, which use negative voltages for program/erase operations. The electrical isolation between the well and underlying substrate may allow for negative voltages to be used without causing excessive leakage current. In other applications, electrical isolation of integrated circuits that include analog and digital circuit portions, such as mixed signal or mixed mode transistors, may reduce noise coupling between the digital portions and the analog portions. Problems from noise coupling can arise since analog circuit portions tend to be noise-sensitive, while relatively high-power switching transistors, such as output transistors associated with the digital circuit portions, tend to generate noise. In a mixed signal circuit, noise from an output transistor can be coupled to an analog circuit portion through the semiconductor substrate shared by the entire integrated circuit. The severity of this noise coupling problem therefore depends upon how effectively the transistor is isolated from the substrate.

Electrical isolation between a transistor and an underlying substrate may be accomplished by various methods. One approach may include surrounding a circuit well with a material which is dissimilar to that of the substrate, such as a dielectric or a layer of an opposite conductivity type to that of the circuit well. Unfortunately, such a method may require several process steps, thereby increasing overall process time and manufacturing costs. Consequently, production throughput may also be reduced. It would therefore, be desirable to develop a method and a structure, which effectively isolates a transistor from an underlying substrate in a reduced number of process steps.

SUMMARY OF THE INVENTION

The problems outlined above may be in large part addressed by a device and a method for isolating a circuit well from a substrate of the same conductivity type. In particular, an integrated circuit is provided which includes a circuit well arranged over a semiconductor substrate, with no layer of opposite conductivity type arranged between the well and the substrate. The integrated circuit may further include a pair of isolation wells extending along opposite lateral boundaries of the circuit well. The isolation wells and circuit well may be adapted such that a single continuous depletion region underlying the circuit well may be formed upon application of an isolation voltage (e.g. the power supply voltage of the integrated circuit) between the substrate and the pair of isolation wells. The formation of such a depletion region may beneficially isolate the circuit well from the underlying substrate. Consequently, a method is provided in which to form such an integrated circuit. As such, a method is provided for forming a circuit well over a semiconductor substrate and forming a pair of isolation wells extending along opposite lateral boundaries of the circuit well. In addition, a method of operating such a transistor is provided. In particular, the method may include applying an isolation voltage between the semiconductor substrate and the isolation well surrounding the circuit well to form a single continuous depletion region isolating the circuit well from the underlying substrate.

As stated above, the integrated circuit as recited herein may include a circuit well and a pair of isolation wells. In a preferred embodiment, the circuit well and the isolation wells are adapted such that a single continuous depletion region underlying the circuit well may be formed upon application of an isolation voltage between the substrate and the isolation wells. For example, the circuit well may be arranged within a semiconductor substrate of the same conductivity type. Preferably, there is no layer of opposite conductivity type formed between the circuit well and the substrate. In addition, the pair of isolation wells may extend along opposite lateral boundaries of the circuit well. In an embodiment, the circuit well may be elongated in one lateral dimension and the pair of isolation wells may extend parallel to the respective lateral dimension. In addition, the pair of isolation wells may form opposite sides of an annular isolation structure. In some embodiments, a dielectric isolation region may be interposed between the circuit well and each of the pair of isolation wells. The isolation wells may be of opposite conductivity type to the circuit well. Furthermore, the carrier concentrations of the circuit well and the isolation wells may be greater than that of the substrate.

The integrated circuit may further include a transistor formed within the circuit well and a contact connected to the circuit well. In one embodiment, the transistor and the contact may be spaced apart along an elongated dimension of the circuit well, such that the contact is not interposed between the transistor and either of the isolation wells. Alternatively or in addition, the integrated circuit may include metallization adapted to connect the isolation voltage between the substrate and the pair of isolation wells. The metallization may be further adapted to connect a well voltage to the circuit well. Such a well voltage may be equal to the voltage level of the voltage applied to the substrate. Alternatively, the well voltage may be above or below the substrate voltage in order to produce a reverse bias across a junction between the circuit well and the isolation wells. In some cases, the reverse bias across the junction between the circuit well and isolation wells may be larger than across a junction between the substrate and the isolation wells. For example, in an embodiment in which the substrate and circuit well are p-type and the pair of isolation wells is n-type, the metallization may be adapted to connect the circuit well to a more negative voltage than the substrate. In addition, the metallization may be further adapted to connect a source of a transistor formed within the circuit well to the well voltage.

A method for forming such an integrated circuit is contemplated herein. The method may include forming a circuit well over a semiconductor substrate of the same conductivity type. Preferably, no layer of opposite conductivity type is formed between the circuit well and the substrate underlying the circuit well. The method may further include forming a pair of isolation wells of opposite conductivity type to that of the circuit well. In particular, the isolation wells may be formed along opposite lateral boundaries of the circuit well. In a preferred embodiment, the circuit well and the isolation wells are adapted such that a single continuous depletion region underlying the circuit well is formed upon application of an isolation voltage between the substrate and the isolation wells. In an embodiment, the isolation voltage may be the power supply voltage used for the integrated circuit. In addition, the method may include forming a transistor within the circuit well.

In a further embodiment, the method may include forming metallization above the transistor and isolation wells, such that the metallization is adapted to connect the isolation voltage between the substrate and the pair of isolation wells. The metallization may be further adapted to connect a well voltage to the circuit well. Such a well voltage may be equal to the voltage level of the voltage applied to the substrate. Alternatively, the well voltage may be higher or lower than the substrate voltage in order to produce a reverse bias across a junction between the circuit well and the isolation wells. In some cases, the reverse bias across the junction between the circuit well and isolation wells may be larger than across a junction between the substrate and the isolation wells. For example, in an embodiment in which the substrate and circuit well are p-type and the pair of isolation wells is n-type, the metallization may be adapted to connect the circuit well to a more negative voltage than the substrate.

A method for operating such a transistor may include applying an isolation voltage between a semiconductor substrate and an isolation well surrounding a circuit well within the substrate. Such an application of voltage may form a single continuous depletion region isolating the circuit well from the underlying semiconductor substrate. The operating method may further include applying a well voltage to the circuit well to reverse bias a junction between the circuit well and the isolation well. In particular, applying a well voltage may include forming a larger reverse bias between the circuit and isolation wells than is formed between the isolation well and the substrate. As such, in an embodiment in which the substrate and circuit well are p-type and the isolation well is n-type, the circuit well may be at a more negative potential than the semiconductor substrate.

There are several benefits from forming a single depletion region between a circuit well and a substrate. For example, the depletion region may allow a transistor to be electrically isolated from the underlying substrate. In particular, sensitive transistors in integrated circuits, such as mixed signal integrated circuits, may be isolated from noise sources. In addition, a single depletion region may allow a transistor to be operated at voltages below the substrate voltage, such as in non-volatile memory circuits in which negative voltages are used for program/erase operations. Furthermore, the circuit well and substrate may be isolated without the formation of a dissimilar material within the substrate. As such, the method for forming a transistor, which is capable of producing a single depletion region, may reduce the number of costly processes, such as multiple well formations. In addition, the formation of such a transistor may enhance the performance of the circuit, lower manufacturing costs, and increase production throughput.

BRIEF DESCRIPTION OF THE DRAWINGS

Other objects and advantages of the invention will become apparent upon reading the following detailed description and upon reference to the accompanying drawings in which.

Figure 1:
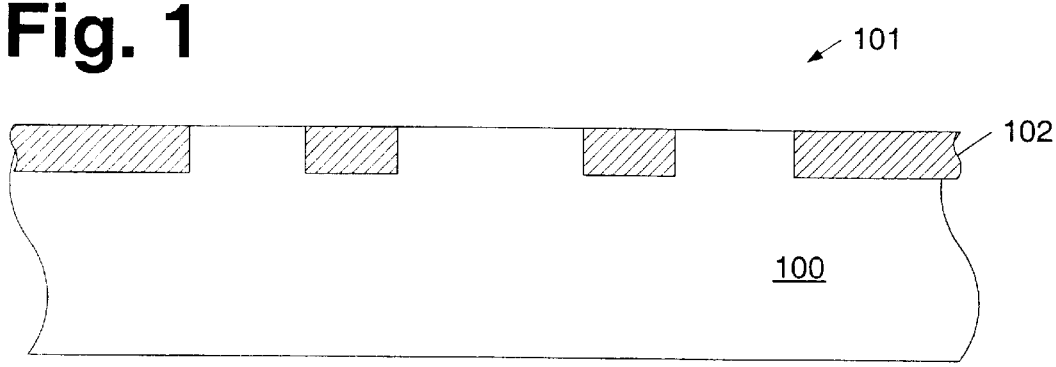
FIG. 1 depicts a partial cross-sectional view of a semiconductor topography in which isolation regions are formed within a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of a device and a method for isolating a circuit well from a semiconductor substrate of the same conductivity type are shown in FIGS. 1–10. FIG. 1 depicts semiconductor topography 101 in which isolation regions 102 are formed within substrate 100. Substrate 100 may be a silicon substrate. More specifically, substrate 100 may be a monocrystalline silicon substrate or an epitaxial silicon layer grown on a monocrystalline silicon substrate. In addition, substrate 100 may include a silicon on insulator (SOI) layer, which may be formed upon a silicon substrate. In a preferred embodiment, substrate 100 may be doped either n-type or p-type. More specifically, substrate 100 may in some embodiments be doped to a concentration between approximately $2.0 \times 10^{13}$ $cm^{-3}$ to approximately $2.0 \times 10^{15}$ $cm^{-3}$. In one embodiment, substrate 100 may be doped to a concentration of approximately $2.0 \times 10^{14}$ $cm^{-3}$. Larger or smaller substrate doping concentrations, however, may be used depending on the design specifications of the device and/or other operational parameters as discussed below.

Isolation regions 102 may be field oxide regions such as regions of undoped silicon dioxide, which may serve to separate active regions of semiconductor topography 101. The widths of isolation regions 102 are preferably approximately 0.4 microns or greater. In one embodiment, the isolation region between a subsequently formed circuit well and isolation well may be approximately 0.65 microns. Isolation regions 102 may be formed by a number of techniques such as shallow trench isolation (STI), recessed oxide isolation (ROI), or local oxidation of silicon (LOCOS). In an embodiment, the upper surface of isolation regions 102 may be substantially coplanar with the upper surface of substrate 100. Alternatively, the upper surface of isolation regions 102 may be elevationally above or below the upper surface of substrate 100.

Figure 2:
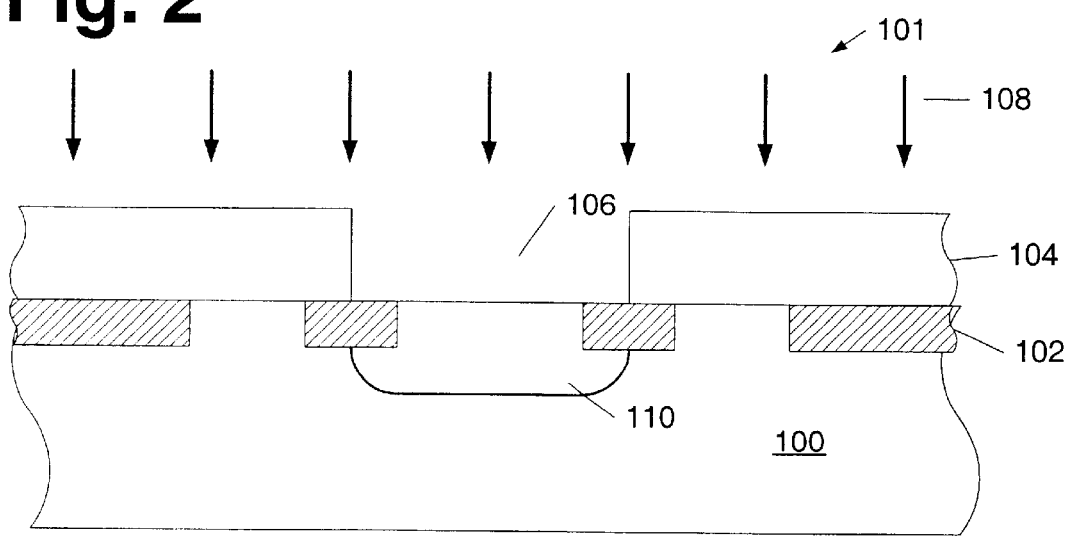
FIG. 2 depicts a partial cross-sectional view of the semiconductor topography in which a masking layer is formed upon the substrate subsequent to the isolation region formation of FIG. 1, and impurities are subsequently introduced into the masking layer and an exposed portion of the semiconductor topography.

Masking layer 104 may be formed upon semiconductor topography 101 as shown in FIG. 2. Masking layer 104 may include a photoresist layer such as a deep ultraviolet resist, an I-line resist, a G-line resist, or another resist, such as an e-beam resist or an x-ray resist. Alternatively, masking layer 104 may include any material compatible with semiconductor fabrication that may be effectively patterned over a substrate. As shown in FIG. 2, masking layer 104 may be patterned such that region 106 of semiconductor topography 101 may be exposed. In this manner, masking layer 104 may serve to prevent the introduction of impurities in the respective underlying portions of semiconductor topography 101.

FIG. 2 further illustrates an introduction of impurities 108 into masking layer 104 and region 106 of semiconductor topography 101 to form circuit well 110 within region 106 of substrate 100. Impurities 108 may include dopants of substantially one conductivity type, either n-type or p-type. In an embodiment in which n-type dopants are used, impurities 108 may include, for example, phosphorus, arsenic, or antimony. By contrast, in an embodiment in which p-type dopants are used, impurities 108 may include, for example, boron, boron difluoride, or indium. In a preferred embodiment, impurities 108 are of the same conductivity type as substrate 100. In a further embodiment, there is no layer of opposite conductivity type arranged between circuit well 110 and substrate 100 underlying circuit well 110.

The introduction of impurities 108 may include a single implant or a series of implants sufficient to create a well with a specific depth and/or concentration profile. In an embodiment, the carrier concentration of circuit well 110 may be greater than that of substrate 100. More specifically, circuit well 110 may be doped to a concentration between approximately $5.0 \times 10^{16}$ $cm^{-3}$ to approximately $2.0 \times 10^{17}$ $cm^{-3}$. In addition, circuit well 110 may have a width between approximately 1.5 microns and approximately 5.0 microns. In one embodiment, the width of circuit well 110 may be approximately 3.0 microns. In another embodiment, the width of circuit well 110 may be less than approximately 2.0 microns if, for example, a transistor is not subsequently formed in the circuit well. In either embodiment, a circuit well with larger or smaller depths and concentrations may be formed depending on the design specifications of the device.

Figure 3:
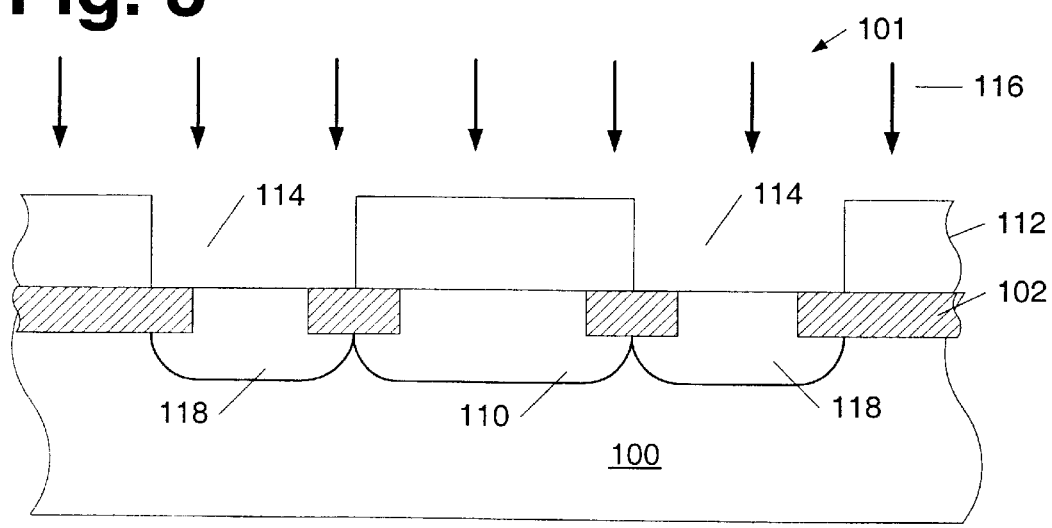
FIG. 3 depicts a partial cross-sectional view of the semiconductor topography in which the masking layer is removed subsequent to the impurity introduction of FIG. 2, an additional masking layer is subsequently formed upon the substrate, and more impurities are introduced into the additional masking layer and exposed portions of the substrate.

FIG. 3 illustrates the removal of masking layer 104 and the formation of masking layer 112. Masking layer 104 may be removed by using stripping processes such as a wet etch or a reactive ion etch. Masking layer 112 may be formed using similar conditions and materials as used for the formation of masking layer 104 in FIG. 2. As such, masking layer 112 may be patterned such that regions 114 of semiconductor topography 101 may be exposed. FIG. 3 also illustrates the introduction of impurities 116 into masking layer 112 and regions 114 of semiconductor topography 101. Such an introduction may form isolation wells 118 within regions 114 of substrate 100, such that isolation wells 118 may extend along opposite lateral boundaries of circuit well 110. In an embodiment, isolation wells 118 may form opposite sides of an annular isolation structure. Alternatively, isolation wells 118 may include multiple isolation wells.

In a preferred embodiment, impurities 116 are of opposite conductivity type as impurities 108 in FIG. 2. As such, isolation wells 118 may be of opposite conductivity type to circuit well 110 and substrate 100. As with the formation of circuit well 110, isolation wells 118 may be formed by a single implant or a series of implants. In an embodiment, the carrier concentration of isolation wells 118 may be greater than that of substrate 100. Furthermore, the carrier concentration of isolation wells 118 may be greater than that of circuit well 110. More specifically, isolation wells may in some embodiments be doped to a concentration between approximately $5.0 \times 10^{16}$ $cm^{-3}$ to approximately $2.0 \times 10^{17}$ $cm^{-3}$. In addition, the widths of isolation wells 118 are preferably approximately 0.5 microns or greater. In one embodiment, isolation wells 118 may have widths of approximately 1.1 microns. However, larger or smaller depths and concentrations of isolation wells 118 may be appropriate depending on the semiconductor device being formed.

FIGS. 2 and 3 illustrate the formation of circuit well 110 and isolation wells 118 directly adjacent to each other. However, the wells may be formed spaced apart from one another. In this manner, masking layers 108 and/or 112 may be modified such that a space exists between the lateral boundaries of circuit well 110 and isolation wells 118. However, such a spacing may require a lower substrate doping concentration and/or a larger isolation voltage such that a single depletion region may be subsequently formed upon application of an isolation voltage to isolation wells 118. The relationship and dependency of these and other parameters for the design of the device are discussed in greater detail below. Furthermore, although the introduction of impurities 108 in FIG. 2 are shown before the introduction of impurities 116 in FIG. 3, the introduction of such impurities may be reversed. In this manner, isolation wells 118 may be formed within substrate 100 before circuit well 110 is formed. In such an embodiment, the formation of masking layers 104 and 112 may be reversed to coincide with their respective well formations.

Figure 4:
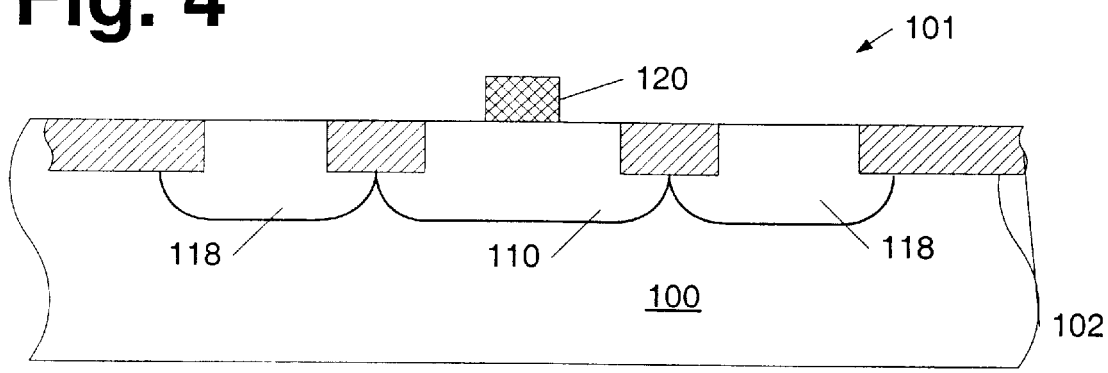
FIG. 4 depicts a partial cross-sectional view of the semiconductor topography in which the additional masking layer is removed subsequent to the impurity introduction of FIG. 3, and a gate structure is formed upon the semiconductor topography.

After the formation of isolation wells 118, masking layer 112 may be removed by stripping processes and gate structure 120 may be formed upon the upper surface of semiconductor topography 101 as shown in FIG. 4. Alternatively, gate structure 120 may be formed after the formation of circuit well 110 in FIG. 2. In such an embodiment, masking layer 112 of FIG. 3 may include masking gate structure 120 such that impurities 116 are not introduced into gate structure 120 during the formation of isolation wells 118. Subsequently, masking layer 112 may be removed. In either embodiment, gate structure 120 may be formed above circuit well 110 in between isolation regions 102. Such a structure may include a conductive layer such as, polysilicon, aluminum, copper, titanium, tungsten, or a metal alloy. In addition, the conductive layer may be formed upon a dielectric layer. Gate structure 120 may also include a cap layer arranged upon the conductive layer. The cap layer may serve to protect gate structure 120 from subsequent processing. In yet another embodiment, the formation of gate structure 120 may be omitted. In such an embodiment, circuit well 110 may serve as an isolating well between wells of opposite conductivity type to that of well 110. Omitting the transistor may allow circuit well 110 to be formed to a width of approximately 2.0 microns or less. In a further embodiment, multiple gate structures and/or different devices may be formed upon circuit well 110. As such, circuit well 110 may be formed to a width greater than approximately 2.0 microns. In general, circuit well 110 may be formed to a width which meets the design specifications of the device.

Figure 5:
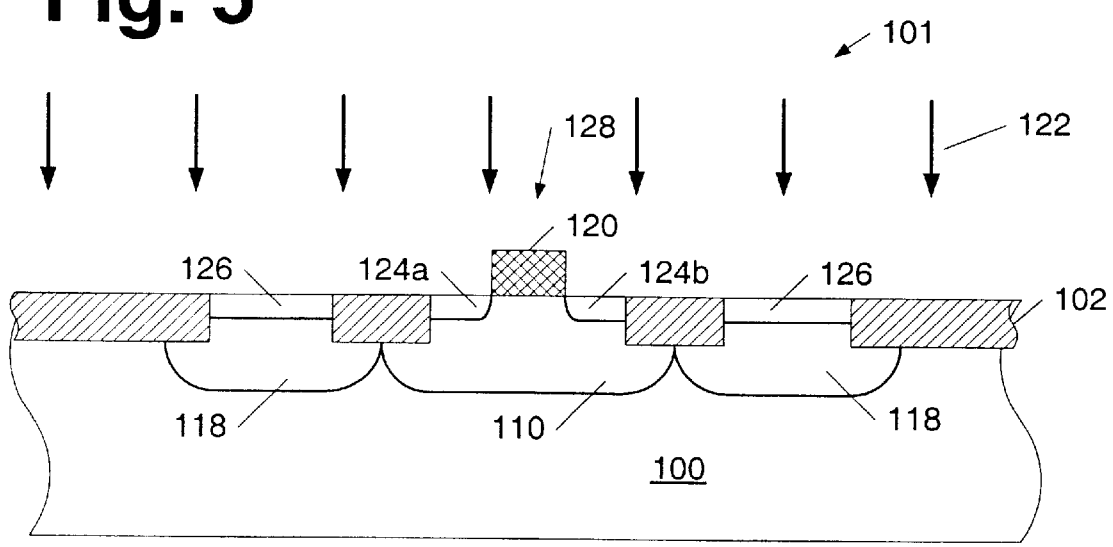
FIG. 5 depicts a partial cross-sectional view of the semiconductor topography in which impurities are introduced into the substrate subsequent to the gate structure formation of FIG. 4.

FIG. 5 illustrates the introduction of impurities 122 to form source and drain regions 124a and 124b self-aligned to gate structure 120. As such, transistor 128 may be formed within circuit well 110. In addition, the introduction of impurities 122 may form regions 126 within isolation wells 118. In a preferred embodiment, impurities 122 are of the same conductivity type as impurities 116 of FIG. 3. In this manner, regions 126 may be of the same conductivity type as isolation wells 118. Furthermore, source and drain regions 124a and 124b may be of opposite conductivity type as circuit well 110. In addition to the structure of FIG. 5, lightly doped drain regions and spacers (not shown) may be formed prior to the introduction of impurities 122.

Figure 6:
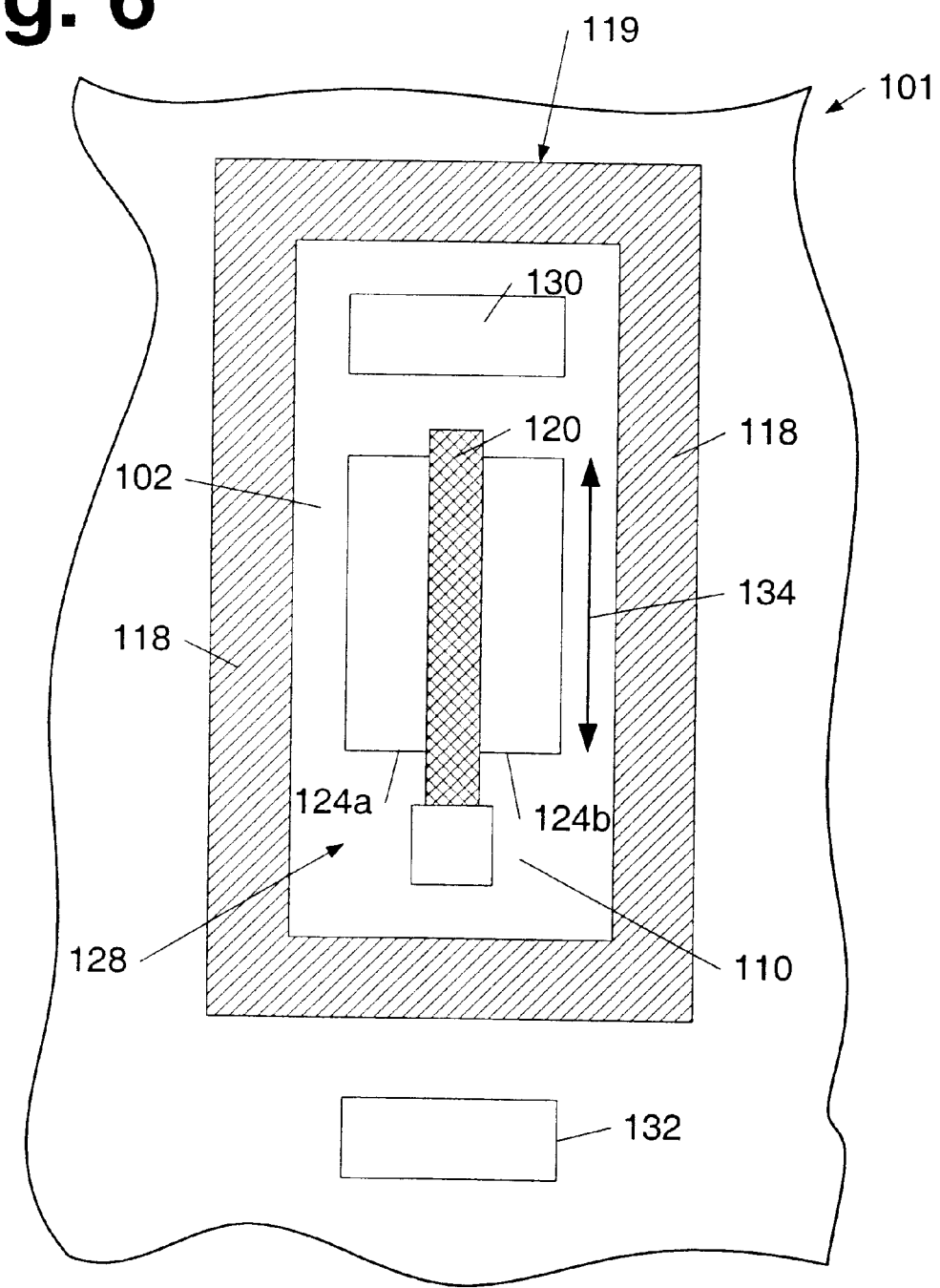
FIG. 6 depicts an exemplary top view of the semiconductor topography subsequent to the impurity introduction of FIG. 5.

An exemplary top view of semiconductor topography 101 of FIG. 5 is shown in FIG. 6. Semiconductor topography 101 may form part of an integrated circuit. The top view of semiconductor topography 101 is shown with transistor 128 and contact region 130 formed within circuit well 110. As described above, transistor 128 may include gate structure 120 and source and drain regions 124a and 124b. In addition, semiconductor topography 101 may include isolation wells 118 extending along opposite lateral boundaries of circuit well 110. In the embodiment of FIG. 6, isolation wells 118 form part of annular doped region 119. As used herein, "annular" refers to an encircling shape which may be rectangular, circular, or any shape suitable for surrounding another region. However, in some embodiments, the two long sides of annular region 119 may be sufficient to subsequently form a depletion region under circuit well 110. In addition, semiconductor topography 101 may include isolation regions 102 formed over portions of circuit well 110 not underlying transistor 128 and contact region 130. In this manner, the upper portions of circuit well 110 and isolation wells 118 may be isolated from each other. Such isolation regions may also be formed in other regions of semiconductor topography 101, such that structures formed within semiconductor topography 101 may be isolated from each other.

Semiconductor topography 101 may further include contact region 132 formed within substrate 100. In FIG. 6, contact region 132 is positioned outside of annular region 119. However, contact region 132 may be positioned anywhere on semiconductor topography 101 in which substrate 100 is accessible from the surface. More specifically, contact region 132 may be positioned on any region of semiconductor topography 101 in which circuit well 110, isolation wells 118, isolation regions 102, and/or other similar structures are not formed. Such a region may, in some embodiments, be inside or outside the boundaries of annular region 119.

In FIG. 6, circuit well 110 may be elongated in lateral dimension 134 with isolation wells 118 extending parallel to lateral dimension 134. In addition, transistor 128 and contact region 130 may be spaced apart along lateral dimension 134 in a manner that contact region 130 is not interposed between the transistor 128 and isolation wells 118. Although the elongation of circuit well 110 shown in FIG. 6 is believed to help achieve a continuous depletion region in the substrate below the circuit well, the depletion region may, in some embodiments, be achievable with other layouts. For example, contact region 130 may in some cases be interposed between one of isolation wells 118 and transistor 128. More generally, contact region 130 may be located in several different locations within circuit well 110. Further, although a single transistor is shown within circuit well 110, the circuit well could, in some embodiments, contain multiple transistors and/or other devices, or no transistors.

In an embodiment, metallization may be formed over a semiconductor topography as described herein such that an isolation voltage may be applied between the substrate and the isolation wells to form a single depletion region under the circuit well. Such metallization may include a contact layer formed over the semiconductor topography. The contact layer may generally include conductive contact structures and interconnects interposed with dielectric material. The conductive interconnects may be adapted to connect portions of the circuit with each other and/or with contact pads at the periphery of the die. In addition, conductive interconnect lines may be used to connect particular features of the circuit to contact pads used for connection to, for example, external power supply leads of the ensuing packaged integrated circuit. Such contact pads may be arranged at the periphery of the semiconductor die, or may be spaced across the die, depending on the packaging technology used. The formation of metallization may also include the formation of one or more interlevel dielectric layers, such that interconnect lines connecting particular features of the circuit may be electrically isolated from underlying features.

Figure 7:
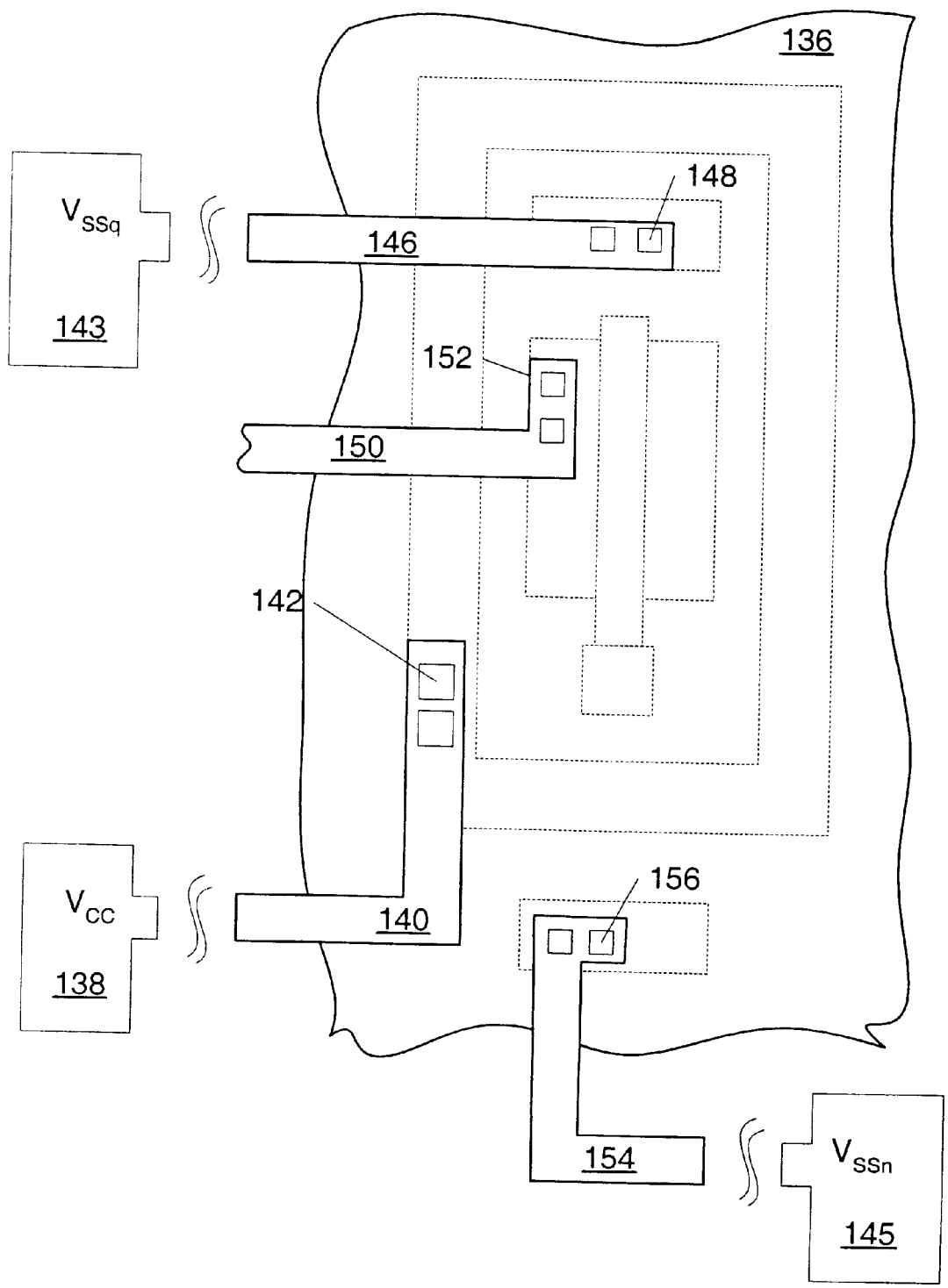
FIG. 7 depicts an exemplary top view of the semiconductor topography in which metallization is formed upon the topography subsequent to the impurity introduction of FIG. 5.

FIG. 7 illustrates an embodiment in which metallization has been formed upon semiconductor topography 101 of FIG. 6. In particular, the metallization may include interconnect lines 140, 146, 150, and 154 formed over a contact layer. The contact layer may include interlevel dielectric layer 136, which serves to vertically isolate the interconnect lines from the features of FIG. 6. (The dashed lines indicate the boundaries of the features of FIG. 6.) The contact layer may further include contacts (conductive tap structures) extending through interlevel dielectric 136 to contact the appropriate features below. As such, tap structures 142, 148, 152, and 156 are shown in the metallization of FIG. 7, and are intended to indicate only which features are being contacted, and not the particular number or size of contacts used. It is noted that the view of FIG. 7 may be greatly simplified by comparison to actual interconnect lines, which may include multiple bends and be routed using multiple metallization levels. Furthermore, many needed interconnects, such as those connecting transistor 128 to other transistors and/or circuit elements, are not shown in the view of FIG. 7.

By reference to the dashed lines and the top view of FIG. 6, it can be seen that interconnect line 140 of FIG. 7 may make contact to annular region 119 and thereby isolation wells 118 using tap structures 142. In the embodiment in which circuit well 110 is p-type and isolation wells 118 are n-type, interconnect line 140 may extend to contact pad 138, which is designated for connection to $V_{CC}$, the high power supply voltage (upper polarity of the supply voltage) for the integrated circuit. Multiple other features on the semiconductor die not shown in FIG. 7 may also be connected to contact pad 138, using interconnect line 140 or other interconnects not shown. In some embodiments, interconnect line 140 could be used to connect isolation wells 118 to a filtered or a "quiet" $V_{CC}$.

FIG. 7 also illustrates interconnect line 154 connected to contact region 132 (connection to the substrate) using tap structures 156. Such an interconnect line may be connected to contact pad 145. Contact pad 145 may be designated for connection to $V_{SS}$, or the low power supply voltage (lower polarity of the supply voltage) for the integrated circuit. The metallization of FIG. 7, therefore, may be adapted to connect an isolation voltage between substrate 100 and isolation wells 118. The embodiment of FIG. 7 may also include interconnect line 146 connected to contact region 130 (connection to the circuit well) using tap structures 148. In addition, interconnect line 146 may be connected to contact pad 143. Similar to contact pad 145, contact pad 143 may be designated for connection to $V_{SS}$, or the low power supply voltage (lower polarity of the supply voltage) for the integrated circuit. In one embodiment, contact pad 143 may be a filtered or a "quiet" $V_{SS}$ ($V_{SSq}$) and contact pad 145 may be a "standard" $V_{SS}$ ($V_{SSn}$) as illustrated in FIG. 7. In this manner, transistor 128 may be isolated from noise generated elsewhere in the circuit. In such an embodiment, the "quiet" and "standard" $V_{SS}$ may have approximately the same nominal voltage applied to them, but may not be physically connected. Alternatively, the "quiet" and "standard" $V_{SS}$ may be connected on the die, package, or PCB. "Standard" $V_{SS}$ may sometimes be referred to as "noisy" $V_{SS}$.

Figure 8:
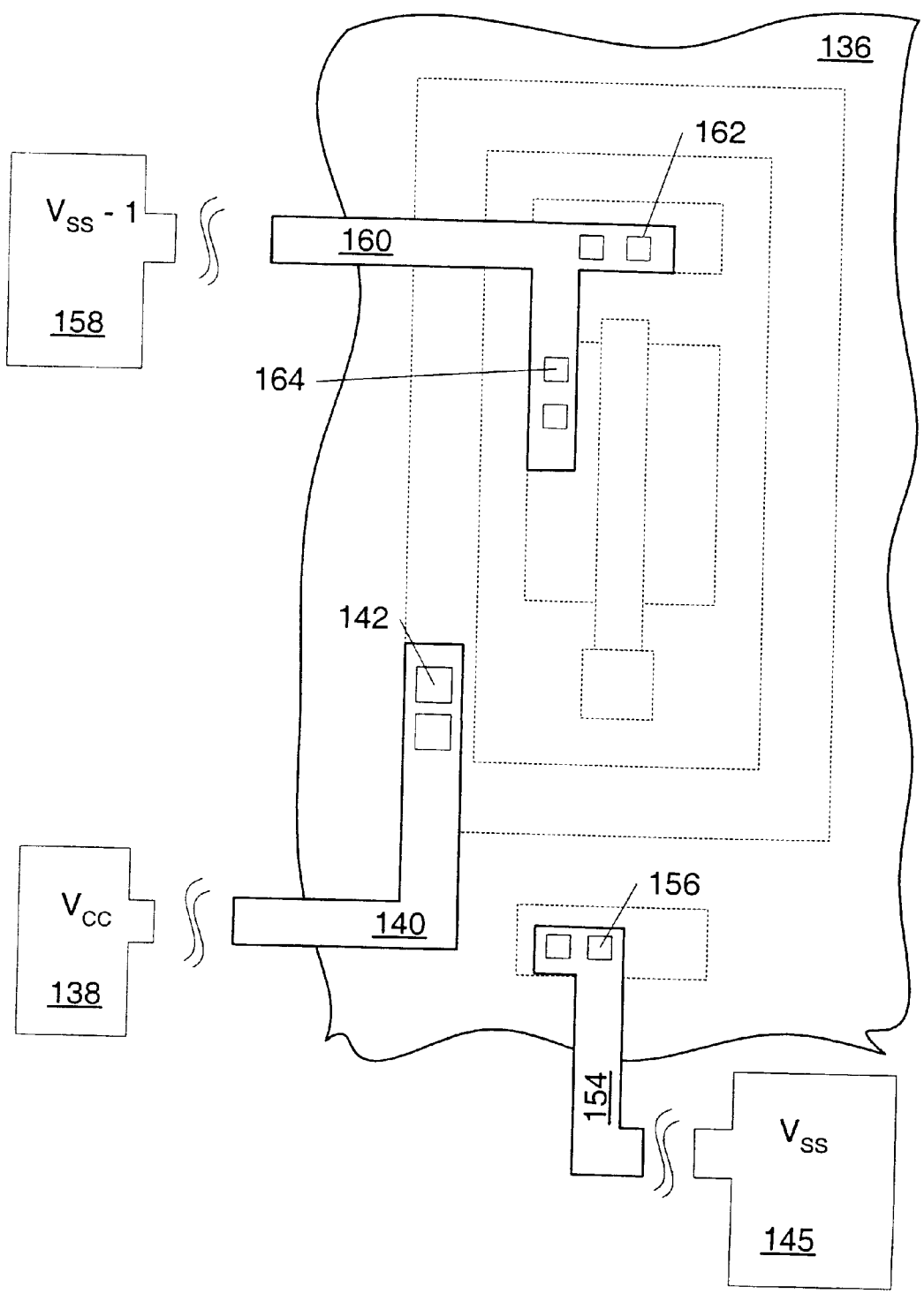
FIG. 8 depicts a top view of the semiconductor topography, in an alternative embodiment, in which metallization is formed upon the topography subsequent to the impurity introduction of FIG. 5.

Consequently, the metallization of FIG. 7 may be adapted to connect a well voltage to circuit well 110 to reverse bias a junction between circuit well 110 and isolation wells 118 as well as connect an isolation voltage to reverse bias a junction between isolation wells 118 and substrate 100. In an embodiment, the metallization of FIG. 7 may be adapted to connect a well voltage to circuit well 110 that is substantially equal to the substrate voltage. Alternatively, the well voltage may be connected to higher or lower voltage levels than the substrate as shown in FIG. 8. For example, in an embodiment in which the substrate and circuit well are p-type and the pair of isolation wells is n-type, the metallization may be further adapted to connect the circuit well to a more negative voltage than the substrate. The metallization of FIG. 7 may be further adapted to connect source 124a of transistor 128 to a voltage supply. In particular, the metallization may include interconnect line 150 connected to source 124a using tap structures 152. The voltage supply for interconnect line 150 may be the same as that used for interconnect line 146 or a different power supply. As such, FIG. 7 shows one end of interconnect line 150 indefinitely connected, indicating that the line may be connected to either contact pad 143 or an internal node other than $V_{SS}$.

Furthermore, the metallization of FIG. 7 may include other interconnects (not shown). For example, the metallization of FIG. 7 may be adapted to connect drain 124b of transistor 128 to a voltage higher than that of source 124a. Drain 124b may be connected to a terminal of a neighboring transistor within the integrated circuit, for example. Although FIG. 7 illustrates an embodiment in which circuit well 110 and substrate 100 are p-type and isolation wells 118 are n-type, it is noted that the conductivity of the regions may be reversed and thus the voltage levels applied to such regions may be reversed.

An alternative embodiment of the metallization of FIG. 7 is illustrated in FIG. 8. In such an embodiment, isolation wells 118 and contact region 132 may be connected to contact pads 138 and 145 via interconnect lines 140 and 154, respectively. However, in the embodiment of FIG. 8, the metallization may be adapted to connect circuit well 110 to a more negative voltage than substrate 100. Applying such a voltage may produce a larger reverse bias between circuit well 110 and isolation wells 118 than is formed between isolation wells 118 and substrate 100 with the application of the isolation voltage. As such, the metallization of FIG. 8 may include interconnect line 160 connected to contact region 130 and source region 124a using tap structures 162 and 164, respectively. Alternatively, the metallization may include separate interconnect lines (not shown) connected to contact region 130 and source region 124a. In such an embodiment, the separate interconnect lines may be designated to distinct power supplies. Interconnect line 160 may be connected to contact pad 158. Contact pad 158 may be designated for connection to a voltage level equal to, higher, or lower than the substrate voltage (but less than $V_{CC}$). In FIG. 8, for example, contact pad 158 is designated for connection to $V_{SS}-1$, or a voltage which is 1 volt less than $V_{SS}$. In an embodiment in which two distinct interconnect lines and contact pads are used to connect to contact region 132 and source region 124a, one or both of the contact pads may be designated for connection to a voltage level equal to, higher, or lower than the substrate voltage (but less than $V_{CC}$).

Figure 9:
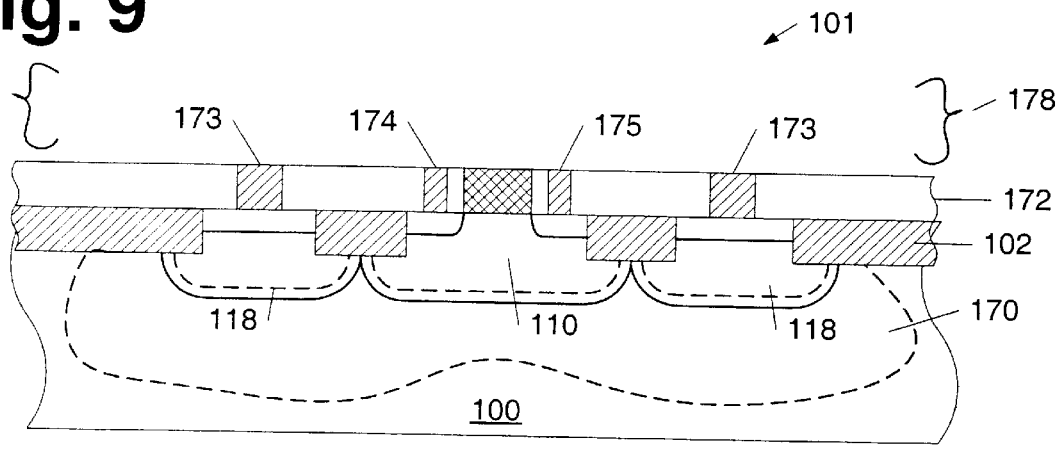
FIG. 9 depicts a partial cross-sectional view of the semiconductor topography in which a single continuous depletion region is formed within the substrate subsequent to the metallization formation of FIG. 7 or FIG. 8.

Turning to FIG. 9, a cross sectional view of semiconductor topography 101 of FIG. 5 is shown with metallization such as that of FIG. 7 or FIG. 8. As such, contact layer 172 may be arranged above isolation wells 118, circuit well 110, gate structure 120, and isolation regions 102. Furthermore, one or more additional conductive and/or dielectric layers (not shown) may be formed above contact layer 172 in the area referenced by numeral 178. As such, the topography of FIG. 9 may be packaged for use as an integrated circuit so that electrical power may be provided to the topography. Alternatively, the topography of FIG. 9 may not be packed, such that the contact pads of the topography may be exposed for electrical probe testing.

Contact layer 172 may include conductive contact structures and interconnects within dielectric material. In particular, contact layer 172 may include contact structures 173, 174, and 175 within dielectric 136. Dielectric 136 may include one or more interlevel dielectric layers, such that the interconnect lines may be electrically isolated from underlying features. Contact structures 173 may be connected to isolation wells 118, while contact structures 174 and 175 may be connected to source and drain regions 124a and 124b, respectively. Such contact structures may be adapted to connect portions of the circuit with each other and/or with contact pads at the periphery of the die. As such, contact layer 172 may include conductive interconnect lines that may be used to connect such conductive structures to contact pads used for connection to external power supply leads of the ensuing packaged integrated circuit. For example, contact layer 172 may include a layout of interconnect lines similar to that of FIG. 7. As such, contact structures 173 may be connected to interconnect line 140 and contact structure 174 may be connected to interconnect line 150. Alternatively, contact layer 172 may include a layout of interconnect lines similar to that of FIG. 8. In this manner, contact structure 174 may be connected to interconnect line 160. As with the interconnect line layouts FIGS. 7 and 8, contact layer 172 may include additional interconnect lines with which to connect contact structures to other transistors and/or circuit elements. In another embodiment, contact layer 172 may include a layout of interconnect lines substantially different from FIGS. 7 and 8.

In addition, FIG. 9 illustrates the formation of single continuous depletion region 170 underlying circuit well 110. Such a depletion region may be the result of a voltage application between the substrate and contact structures 173, which are formed upon isolation wells 118. More specifically, individual depletion regions may be formed in the vicinity of the junctions between isolation wells 118 and the surrounding p-type regions, including circuit well 110 and substrate 100, upon the application of an isolation voltage between isolation wells 118 and substrate 100. Due to the lighter doping level of substrate 100 as compared to circuit well 110 and isolation wells 118, the individual depletion regions may extend significantly farther (both vertically and laterally) into substrate 100 than into isolation wells 118 or circuit well 110. In this manner, the individual depletion regions may merge to form single continuous depletion region 170. As such, depletion region 170 is preferably extensive enough to isolate circuit well 110 from substrate 100.

Furthermore, circuit well 110 and substrate 100 may be isolated without the formation of a dissimilar material within the substrate. In other words, in an embodiment in which substrate 100 and circuit well 110 are p-type and isolation wells 118 are n-type, depletion region 170 may create a barrier to the flow of holes between circuit well 110 and substrate 100. Such a restriction of hole flow may minimize the impact of any localized substrate potential variations on transistor 128, especially if circuit well 110 is connected to a quiet power supply. Such variations may be due to, for example, digital circuit switching. In addition, depletion region 170 may act as a sink for electrons when substrate 100 and circuit well 110 are p-type and isolation wells 118 are n-type. Consequently, electrons which diffuse to the edge of the depletion region 170 may be swept into isolation wells 118, away from circuit well 110. This diffusion may prevent transistor 128 from being disturbed by electrons generated elsewhere in the circuit. Both the hole flow restriction and electron sink features of depletion region 170 may be particularly important for sensitive analog circuits in mixed signal applications, since such features may reduce noise coupling between the digital and analog portions of the circuit. Similar features may also be present when substrate 100 and circuit well 110 are p-type and isolation wells 118 are n-type. More specifically, depletion region 170 may create a barrier to the flow of electrons and act as a sink for holes in such an embodiment.

As stated above, depletion region 170 may be formed by applying an isolation voltage between substrate 100 and isolation wells 118. In an embodiment, the isolation voltage may be the power supply voltage for the integrated circuit. If the substrate and circuit well are p-type and the isolation wells are n-type as in FIGS. 7 and 8, the voltage applied to the isolation wells may be any voltage greater than the most positive of any voltages applied to substrate 100, circuit well 110, or source and drain regions 124a and 124b. Based on current power supply levels, the isolation voltage may vary from approximately 1.2 volts to approximately 5 volts. Voltages on the upper end of the available range for a given circuit are desirable since they may create a wider depletion region. The width of the depletion region as used herein refers to the vertical dimension of the region between circuit well 110 and substrate 110. Larger or smaller voltages than the range given above, however, may be appropriate depending on the design parameters of the semiconductor device being formed.

As noted above in discussion of FIG. 8, the metallization of semiconductor topography 101 may be adapted to connect circuit well 110 to a more negative voltage than substrate 100. In conventional unisolated transistors, connecting a circuit well to a more negative voltage than the substrate may create an unfavorably large leakage current. However, the extension of depletion region 170 across circuit well 110 as described herein may allow circuit well 110 to be connected to a more negative voltage than substrate 100 without creating a significant leakage current, as demonstrated by FIG. 10 below. Source and drain voltages may then go as low as the well voltage in some embodiments. The amount the well voltage may be reduced below the substrate voltage may be limited by the width of depletion region 170. Therefore, it may be advantageous to create a depletion region as wide as possible. Alternatively, circuit 138 may be designed to form depletion region 170 to a specified width for a given isolation voltage such that a specific well voltage may be accommodated.

The operational and design parameters to form depletion region 170 may vary depending on the design specifications of the device. In particular, the operational and design parameters of the circuit may affect the size of depletion region 170 or even the capability of forming it. As such, isolation wells 118 and circuit well 110 may be adapted such that single depletion region 170 may be formed under circuit well 110. Such adaptations may include a combination of layout specifications and operational parameter specifications. For example, circuit well 110 of FIG. 8 may be elongated in one lateral dimension and isolation wells 118 may extend parallel to the lateral dimension.

In addition or alternatively, the doping concentration of the substrate and/or the voltage level applied between the isolation regions and the substrate may affect the formation of a continuous single depletion region. For example, larger substrate doping concentrations may be usable if spacing between isolation wells 118 and circuit well 110 is relatively narrow (i.e. less than 0.65 microns). Alternatively or in addition, the voltage applied to narrowly spaced isolation wells may be decreased and still sufficiently form single continuous depletion region 170. Likewise, the substrate doping may need to be reduced and/or the applied voltage may be increased if the spacing between isolation wells 118 and circuit well 110 is increased. Alternatively, the spacing between the circuit well and isolation wells may be designed to accommodate a certain substrate doping and/or applied voltage level. Such spacing and other layout specifications may be determined using device simulation programs employed in the art of semiconductor fabrication.

Other parameters such as the doping concentrations of the circuit well and isolation wells, the temperature of the circuit, and/or the critical dimensions of the device may influence the formation of the depletion region. In a preferred embodiment, circuit well 110 and isolation wells 118 may be doped to a higher concentration than substrate 100. Furthermore, the integrated circuit should in some embodiments be maintained between approximately −55° C. and approximately 155° C. Higher temperatures could undesirably narrow the depletion region due to excessive leakage current. In some embodiments, the higher temperatures may inhibit the formation of a single depletion region. In addition, the semiconductor fabrication industry is continually striving to reduce device dimensions. In this manner, as device dimensions are decreased, the operational parameters to form the integrated circuit as described herein may be modified. Such modifications may be achieved by multiplying or dividing the operational parameter by a scaling factor. For example, voltages may be decreased by multiplying the scaling factor by the existing voltage levels. The doping concentrations, on the other hand, may be increased by dividing the doping concentrations by the square of the scaling factor. The scaling factor may represent the fraction of the dimensional reduction as compared to previous devices.

Figure 10:
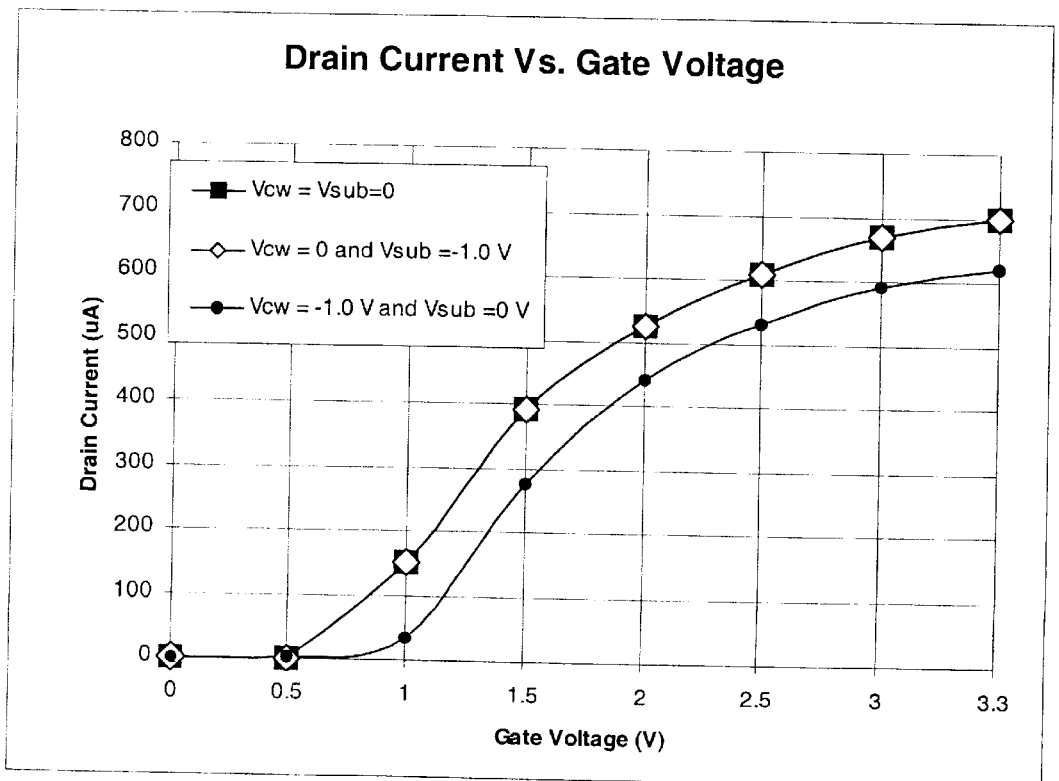
FIG. 10 depicts a plot of drain current versus gate voltage of the transistor of FIG. 9 when the substrate and circuit well are connected to a variety of voltages.

FIG. 10 is a plot of drain current versus gate voltage in the linear region of operation of a transistor similar to transistor 128. The conditions used to plot FIG. 10 included applying 0.1 V to the drain and biasing the isolation wells at 5.0 V. In addition, the substrate and circuit well were connected to varying voltages. Three curves are shown: one with both the substrate voltage ($V_{SUB}$) and circuit well voltage ($V_{CW}$) connected to 0.0 V, another with $V_{CW}$ connected to 0.0 V while $V_{SUB}$ is connected to −1.0 V, and the last curve illustrates $V_{CW}$ connected to −1.0 V while $V_{SUB}$ is connected to 0.0 V. The two curves with $V_{CW}$ connected to 0.0 V are identical. Hence, variation of $V_{SUB}$ between 0.0 V and −1.0 V has no effect on the current-voltage curve when the circuit well is connected to 0.0 V, indicating effective isolation of the circuit well from the substrate. The leakage current measured with $V_{SUB}$ =−1.0 V and $V_{CW}$ =0.0 V was a low 12.7 nA. When the circuit well is connected to −1.0 V while the substrate is connected to 0.0 V, the current-voltage curve shifts to a more positive gate voltage due to the increase in threshold voltage. The threshold voltage increases due to the negative voltage applied to the circuit well with respect to the source. This phenomenon is generally referred to as the body effect. The leakage current measured in this case was 37.7 nA. Accordingly, depletion region 170 appears to effectively isolate the circuit well in all of the configurations tested.

It will be appreciated to those skilled in the art having the benefit of this disclosure that this invention is believed to provide a method and a device for isolating a circuit well from a semiconductor substrate of the same conductivity type. Further modifications and alternative embodiments of various aspects of the invention will be apparent to those skilled in the art in view of this description. For example, the dimensional layout of the circuit may vary to meet the design specifications of the device. Such dimensional layout variations may include, for example, varied widths between the pair of isolation regions and the circuit well and/or various locations of the substrate and circuit well contacts. Furthermore, a thermal anneal may follow any of the implants to electrically activate and/or diffuse the dopants. Such an anneal process may be performed immediately after each implant, or the various implant anneals may be combined into one or more steps later in the process. It is intended that the following claims be interpreted to embrace all such modifications and changes and, accordingly, the drawings and the specification are to be regarded in an illustrative rather than a restrictive sense.

What is claimed is:

1. An integrated circuit, comprising:
   a circuit well arranged over a semiconductor substrate of the same conductivity type as the circuit well, wherein no layer of opposite conductivity type is arranged between the well and the substrate underlying the circuit well; and
   a pair of isolation wells extending along opposite lateral boundaries of the circuit well, wherein the isolation wells are of opposite conductivity type to the circuit well, and wherein the isolation wells and circuit well are adapted such that a single continuous depletion region underlying the circuit well is formed upon application of an isolation voltage between the substrate and the pair of isolation wells.

2. The integrated circuit of claim 1, wherein the pair of isolation wells forms opposite sides of an annular isolation structure.

3. The integrated circuit of claim 1, wherein carrier concentrations of the circuit well and the isolation wells are greater than that of the substrate.

4. The integrated circuit of claim 1, wherein the circuit well is elongated in one lateral dimension, and wherein the pair of isolation wells extends parallel to the elongated dimension of the circuit well.

5. The integrated circuit of claim 4, further comprising a transistor formed within the circuit well and a contact diffusion within the circuit well.

6. The integrated circuit of claim 5, wherein the transistor and the contact diffusion are spaced apart along the elongated dimension of the circuit well, such that the contact diffusion is not interposed between the transistor and either of the isolation wells.

7. The integrated circuit of claim 1, further comprising metallization adapted to connect the isolation voltage between the substrate and the pair of isolation wells.

8. The integrated circuit of claim 7, wherein the metallization is further adapted to connect a well voltage to the circuit well to produce a larger reverse bias across a junction between the circuit well and the isolation wells than across a junction between the substrate and the isolation wells.

9. The integrated circuit of claim 8, wherein the substrate and circuit well are p-type and the pair of isolation wells is n-type, and wherein the metallization is further adapted to connect the circuit well to a more negative voltage than the substrate.

10. The integrated circuit of claim 9, further comprising a transistor formed within the circuit well, wherein the metallization is further adapted to connect a source of the transistor to the well voltage.

11. The integrated circuit of claim 1, wherein said isolation voltage comprises a power supply voltage for the integrated circuit.

12. The integrated circuit of claim 1, further comprising a dielectric isolation region interposed between said circuit well and each of said pair of isolation wells.

13. A method for forming an integrated circuit, comprising:
   forming a circuit well over a semiconductor substrate, wherein the circuit well and the semiconductor substrate are of the same conductivity type, and wherein no layer of opposite conductivity type is formed between the circuit well and the substrate underlying the circuit well; and
   forming a pair of isolation wells extending along opposite lateral boundaries of the circuit well, wherein said isolation regions are of opposite conductivity type than said circuit well, wherein the circuit well and the isolation regions are adapted such that a single continuous depletion region underlying the circuit well is formed upon application of an isolation voltage between the substrate and the isolation regions.

14. The method of claim 13, further comprising forming a transistor within the circuit well.

15. The method of claim 13, further comprising forming metallization above the transistor and isolation wells, wherein the metallization is adapted to connect the isolation voltage between the substrate and the pair of isolation wells.

16. The method of claim 15, wherein the metallization is further adapted to connect a well voltage to the circuit well to produce a larger reverse bias across a junction between the circuit well and the isolation wells than across a junction between the substrate and the isolation wells.

17. The method of claim 16, wherein the substrate and circuit well are p-type and the pair of isolation wells is n-type, and wherein the metallization is further adapted to connect the circuit well to a more negative voltage than the substrate.

* * * * *